United States Patent
Zhang et al.

(10) Patent No.: US 9,337,789 B2
(45) Date of Patent: May 10, 2016

(54) DIFFERENTIAL RECEIVER

(71) Applicant: TEXAS INSTRUMENTS INCORPORATED, Dallas, TX (US)

(72) Inventors: Weicheng Zhang, Chengdu (CN); Huanzhang Huang, Plano, TX (US); Yanli Fan, Allen, TX (US); Mark W. Morgan, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 178 days.

(21) Appl. No.: 14/048,750

(22) Filed: Oct. 8, 2013

(65) Prior Publication Data

US 2014/0159814 A1 Jun. 12, 2014

Related U.S. Application Data

(60) Provisional application No. 61/736,395, filed on Dec. 12, 2012, provisional application No. 61/829,107, filed on May 30, 2013.

(51) Int. Cl.
*H03F 3/45* (2006.01)

(52) U.S. Cl.
CPC ........ *H03F 3/45219* (2013.01); *H03F 3/45632* (2013.01); *H03F 2203/45466* (2013.01); *H03F 2203/45646* (2013.01); *H03F 2203/45648* (2013.01)

(58) Field of Classification Search
USPC ................................... 330/258, 262, 255, 257
IPC ......................................................... H03F 3/45
See application file for complete search history.

(56) References Cited

U.S. PATENT DOCUMENTS

| 5,729,178 | A  | * | 3/1998 | Park | H03F 1/0261 330/253 |
| 6,252,435 | B1 | * | 6/2001 | Wu | H03F 3/4521 327/65 |
| 6,377,085 | B1 | * | 4/2002 | Giuroiu | H03F 3/45183 327/563 |
| 2006/0119429 | A1 | * | 6/2006 | Lim | H03F 3/189 330/253 |
| 2006/0132239 | A1 | * | 6/2006 | Kelly | G05F 3/262 330/257 |
| 2007/0024368 | A1 | * | 2/2007 | Abdelatty Ali | H03F 3/45188 330/259 |

\* cited by examiner

*Primary Examiner* — Patricia T Nguyen
(74) *Attorney, Agent, or Firm* — Gregory J. Albin; Frank D. Cimino

(57) ABSTRACT

A differential receiver with reduced common mode induced propagation delay variance. One implementation of a differential receiver includes a first differential amplifier, a second differential amplifier, and a first current source. The first differential amplifier includes a first transistor pair. The second differential amplifier includes a second transistor pair. The first current source is coupled to a drain node of a first transistor of the first transistor pair. The first current source is configured to generate a variable first current at the drain node as of function of a sum of a variable tail current of the first differential amplifier and a variable tail current of the second differential amplifier.

20 Claims, 4 Drawing Sheets

DIFFERENTIAL RECEIVER

CROSS-REFERENCE TO RELATED APPLICATION

The present application claims priority to U.S. Provisional Patent Application No. 61/736,395, filed on Dec. 12, 2012, entitled "A Constant Delay LVDS Receiver," and claims priority to U.S. Provisional Patent Application No. 61/829,107, filed on May 30, 2013, entitled "A Constant Delay LVDS Receiver," both of which are hereby incorporated herein by reference in their entirety.

BACKGROUND

In electronic systems, inter-device communication is often implemented using differential links. In a differential link, a data bit is transferred via two signal lines that carry complementary signals (e.g., a signal and its inverse). The data bit can be resolved at a receiver by subtracting the complementary signals and sampling the result. Differential links are particularly well suited for use in high speed interfaces due to their improved power characteristics and noise immunity.

SUMMARY

Differential receivers with reduced common mode induced propagation delay variance are disclosed herein. In one implementation, a differential receiver includes a first differential amplifier, a second differential amplifier, and a first current source. The first differential amplifier includes a first transistor pair. The second differential amplifier includes a second transistor pair. The first current source is coupled to a drain node of a first transistor of the first transistor pair. The first current source is configured to generate a variable first current at the drain node as of function of a sum of a variable tail current of the first differential amplifier and a variable tail current of the second differential amplifier.

In another implementation, a differential receiver includes a first differential amplifier, a second differential amplifier, and a tail current generator. The first differential amplifier includes a first transistor pair. The second differential amplifier includes a second transistor pair. The tail current generator is coupled to source terminals of the first transistor pair and to source terminals of the second transistor pair. The tail current generator is configured to sense common mode voltage at inputs of the differential receiver, and to generate a variable tail current of the first differential amplifier and a variable tail current of the second differential amplifier based on the common mode voltage.

In a further implementation, a differential receiver includes a pair of negative metal oxide semiconductor (NMOS) transistors, a pair of positive metal oxide semiconductor (PMOS) transistors, and a complementary tail current generator. The complementary tail current generator is coupled to the pair of NMOS transistors and the pair of PMOS transistors. The complementary tail current generator is configured to provide a variable first tail current to the source terminals of the NMOS transistors, to provide a variable second tail current to source terminals of the PMOS transistors, and to vary the first tail current and the second tail current based on common mode voltage at inputs of the differential receiver. The complementary tail current generator includes a translinear loop and a current source. The translinear loop is configured to regulate the first tail current and the second tail current such that a sum of the square roots of the first tail current and the second tail current is a constant value. The current source is configured to ensure that currents corresponding to the first tail current and the second tail current flow in the translinear loop at all common mode input voltages.

BRIEF DESCRIPTION OF THE DRAWINGS

For a detailed description of exemplary embodiments of the invention, reference will now be made to the accompanying drawings in which.

NOTATION AND NOMENCLATURE

Figure 1:
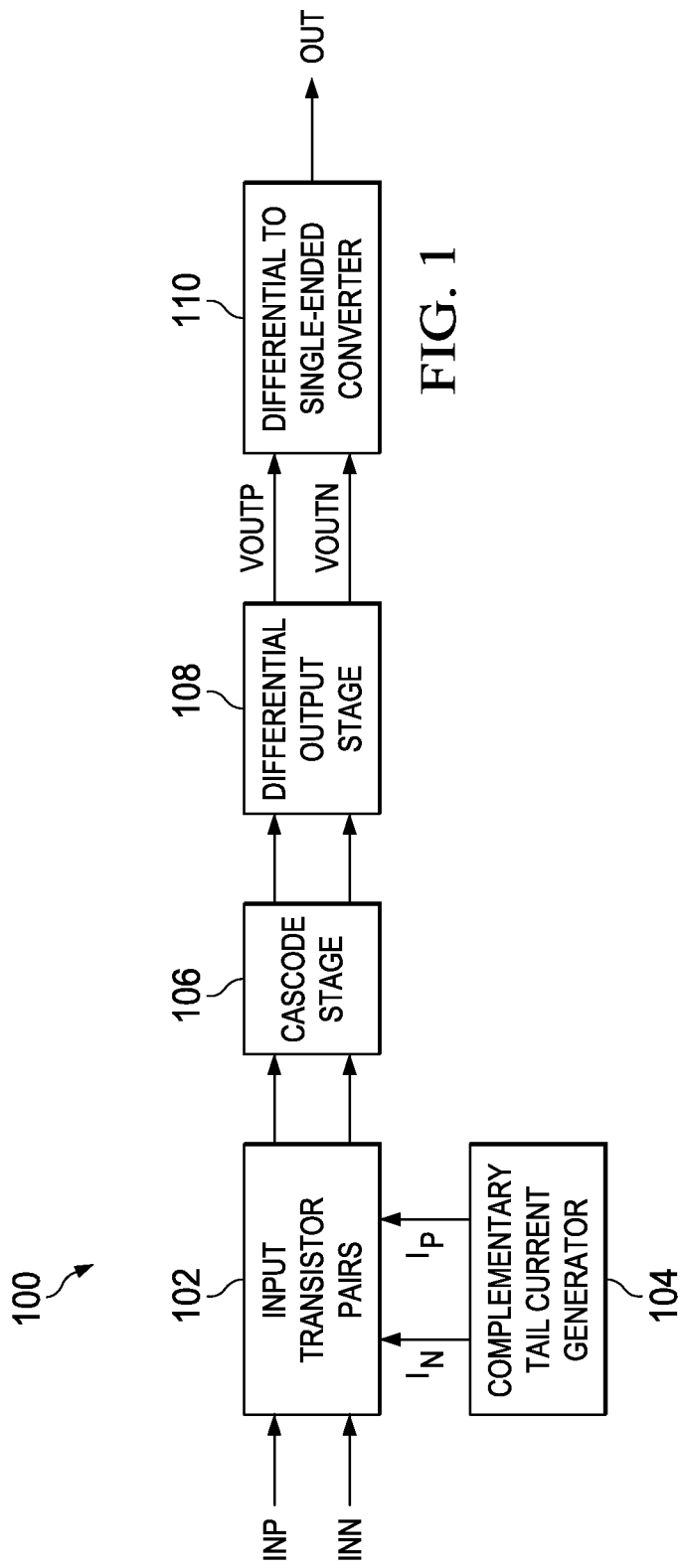
FIG. 1 shows a block diagram of a differential receiver in accordance with principles disclosed herein.

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct electrical connection. Thus, if a first device couples to a second device, that connection may be through a direct electrical connection, or through an indirect electrical connection via other devices and connections. The recitation "based on" is intended to mean "based at least in part on." Therefore, if X is based on Y, X may be based on Y and any number of additional factors.

DETAILED DESCRIPTION

The following discussion is directed to various implementations of a differential receiver. Although one or more of these implementations may be preferred, the implementations disclosed should not be interpreted, or otherwise used, as limiting the scope of the disclosure, including the claims. In addition, one skilled in the art will understand that the following description has broad application, and the discussion of any implementation is meant only to be exemplary, and not intended to intimate that the scope of the disclosure, including the claims, is limited to that implementation.

Differential receivers typically support a fairly wide input common mode voltage range. For example, differential receivers in accordance with the low voltage differential signaling (LVDS) standard generally support up to 2.4 volts of input common mode voltage. In conventional differential receivers, the propagation delay from receiver input to receiver output is highly dependent on the common mode voltage at the receiver inputs. For example, propagation delay in a conventional differential receiver can vary by up to 500 pico-seconds, or more, across the input common mode voltage range. As a result, a conventional differential receiver can introduce skew across related input signals that have different common mode voltages. Such skew degrades the timing margin of the receiver, and limits the maximum operating speed of the differential link supported by the receiver.

The differential receivers disclosed herein reduce common mode voltage induced variation in propagation delay, and in turn, provide improved timing margins with respect to conventional differential receivers. A number of novel delay stabilization techniques are employed to reduce variation in propagation delay induced by common mode voltage. The differential receivers of the present disclosure may include one or more of complementary tail current generation, cascode pole bandwidth compensation, and differential output bandwidth compensation that operate, alone or in combination, to reduce variation in common mode induced propagation delay. The differential receivers disclosed herein may reduce propagation delay variations due to common mode voltage by a factor of ten or more when compared to conventional differential receivers.

FIG. 1 shows a block diagram of a differential receiver 100 in accordance with principles disclosed herein. The differential receiver 100 includes input transistor pairs 102, a complementary tail current generator 104, a cascode stage 106, a differential output stage 108, and a differential to single-ended converter 110. The input transistor pairs 102 include two pairs of source coupled transistors that serve as inputs to the differential receiver 100. The input transistor pairs 102 receive the differential input signal INP/INN, where INP and INN are the positive and negative side respectively of the differential input signal.

The complementary tail current generator 104 provides tail currents $I_N$ and $I_P$ to the input transistors pairs 102. The complementary tail current generator 104 generates the tail currents $I_N$ and $I_P$ based on the common mode voltage present on INP/INN. Accordingly, the tail currents $I_N$ and $I_P$ vary with the common mode voltage present at the inputs of the differential receiver 100.

In conventional differential receivers, the tail currents provided to the input transistors are constant, and the gain provided by the input transistors can be highly non-linear over the range of input common mode voltage to which the receiver is subjected. As a result, the propagation delay varies widely with the input common mode voltage.

By varying the tail currents $I_N$ and $I_P$ with the input common mode voltage, the differential receiver 100 produces a more constant gain over the range of input common mode voltage and reduces the variation in propagation delay resulting from differences in common mode voltage.

The input transistor pairs 102 are coupled to the cascode stage 106. The input transistor pairs alone or in conjunction with the cascode stage 106 form a pair of differential amplifiers. The cascode stage 106 provides buffering of the input transistor pairs 102. Bandwidth variation in the cascode stage 106 resulting from differences in input common mode voltage can affect the propagation delay of the differential receiver 100. The cascode stage 106 includes bandwidth compensation that regulates circuit bandwidth across the range of input common mode voltages. The cascode stage 106 varies the cascode stage bias current in accordance with the input common mode voltage to reduce cascode stage bandwidth variation, and in turn, reduces variation of propagation delay caused by changing bandwidth.

The differential output stage 108 is coupled to the outputs of the cascode stage 106. The differential output stage 108 provides differential voltage output signals VOUTP/VOUTN to the differential to singled-ended converter 110, which converts the differential voltage output signals to a single-ended signal OUT. Variation in common mode voltage on the differential voltage output signals provided to the differential to singled-ended converter 110 can result in propagation delay variations in the differential to singled-ended converter 110.

The differential output stage 108 includes output common mode voltage compensation that restricts the common mode voltage on signals VOUTP/VOUTN to a narrow range. By reducing the range of common mode voltage presented to the differential to singled-ended converter 110, the differential output stage 108 reduces common mode voltage induced propagation delay variation in the differential to singled-ended converter 110.

Figure 2:
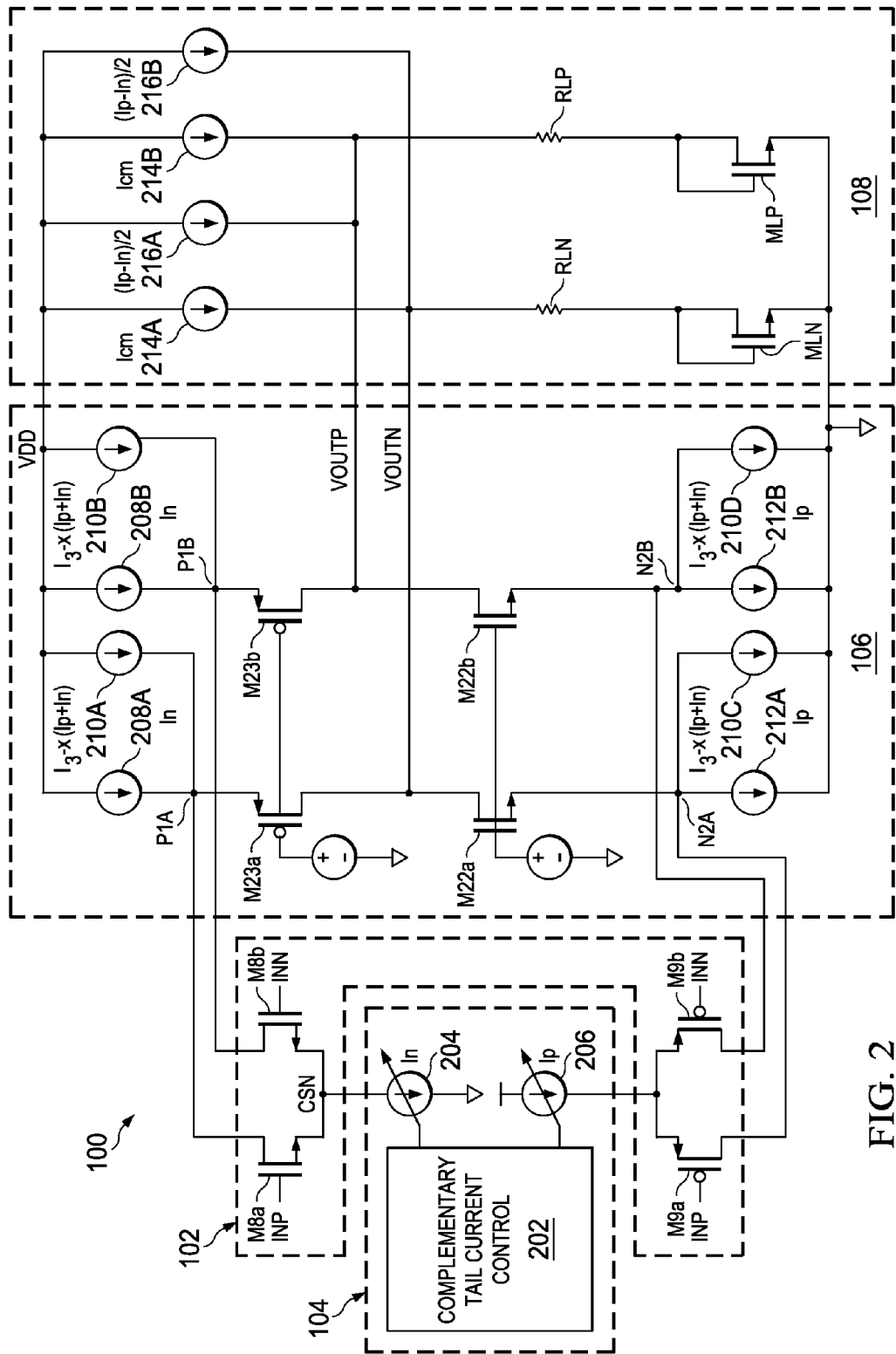
FIG. 2 shows a schematic diagram of a differential receiver in accordance with principles disclosed herein.

FIG. 2 shows a schematic diagram of the differential receiver 100. The differential to single-ended converter 110 has been omitted from FIG. 2 as a matter of clarity. The input transistor pairs 102 include a first pair of transistors (e.g., negative metal oxide semiconductor (NMOS) transistors) M8a and M8b with interconnected source terminals, and a second pair of transistors (e.g., positive metal oxide semiconductor (PMOS) transistors) M9a and M9b with interconnected source terminals. The source terminal of each of the transistors M8a, M8b, M9a, and M9b is coupled to the complementary tail current generator 104. The gate terminal of each of the transistors M8a, M8b, M9a, and M9b is coupled to an input terminal of the differential receiver 100, and receives one of signals INN and INP of the differential input signal presented at the input terminals. The drain terminal of each of the transistors M8a, M8b, M9a, and M9b is coupled to the cascode stage 106.

The complementary tail current generator 104 senses the common mode voltage at the inputs of the differential receiver 100 (i.e., the common mode voltage of the differential signal INN/INP) and generates tail currents $I_N$ and $I_P$ based on the sensed common mode voltage. The complementary tail current generator 104 includes variable current sources 204 and 206 and complementary tail current control circuitry 202 that controls the variable current sources 204 and 206. The variable current source 204 provides bias current $I_N$ to the transistor pair M8a, M8b. The variable current source 206 provides bias current $I_P$ to the transistor pair M9a, M9b. By varying the tail currents $I_N$ and $I_P$ with the input common mode voltage, the differential receiver 100 reduces variation in gain, and in turn reduces the variance in propagation delay due to the common mode voltage.

Figure 3:
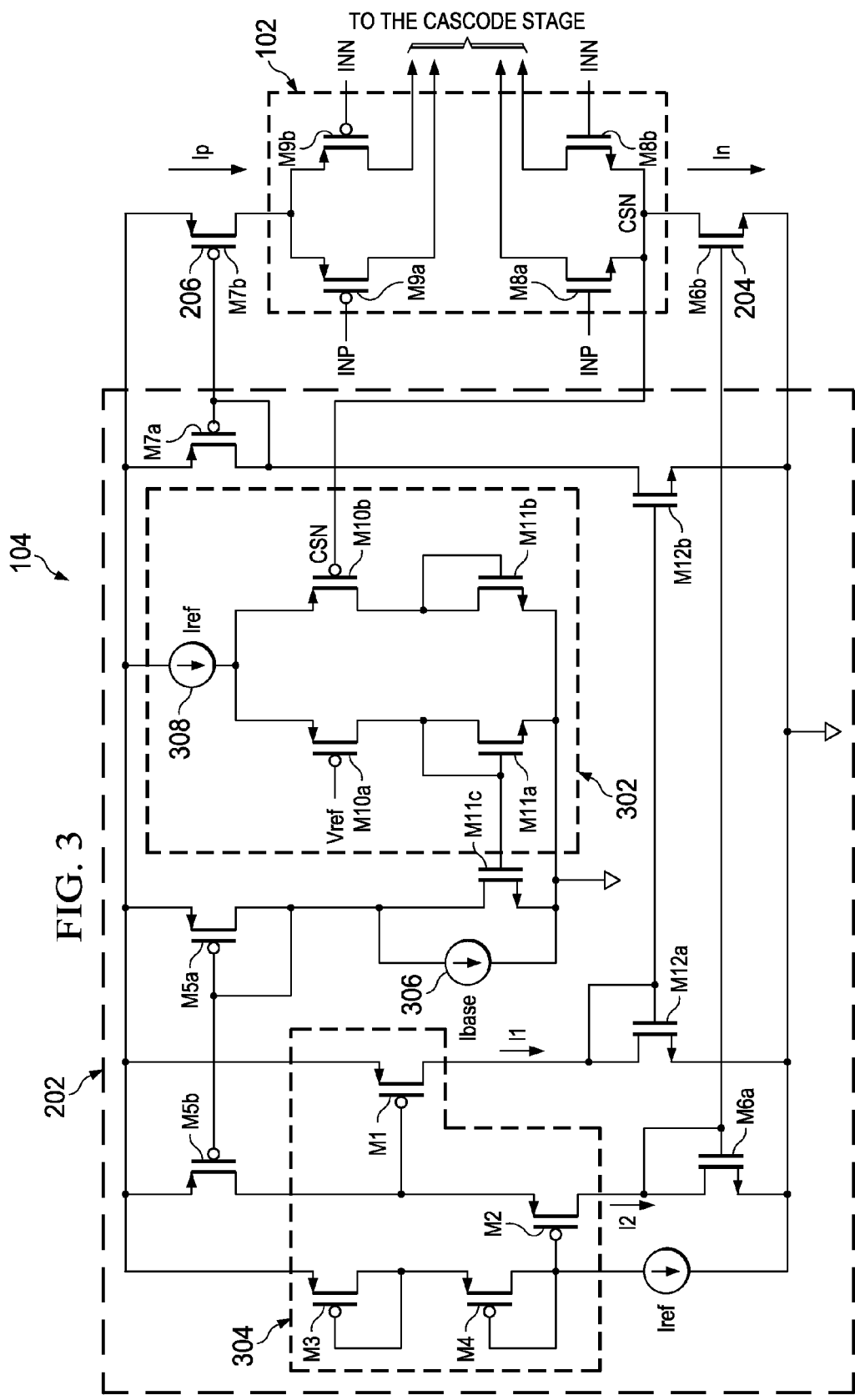
FIG. 3 shows a schematic diagram of a complementary tail current generator in accordance with principles disclosed herein.

FIG. 3 shows a schematic diagram of the complementary tail current generator 104. The input transistor pairs 102 are also shown in FIG. 3. In FIG. 3, the variable current source 204 is shown implemented as transistor M6b, and the variable current source 206 is shown implemented as transistor M7b. The complementary tail current control circuitry 202 includes an amplifier 302, a translinear loop 304, and various other components.

The amplifier 302 includes transistors M10a, M10b, M11a, M11b, and current source 308. The amplifier 302 compares the voltage (CSN) at the source terminals of the transistors M8a, M8b to a reference voltage $V_{REF}$. The voltage CSN accurately represents the common mode voltage at the inputs of the differential receiver 100.

If the common mode input voltage is high, then the voltage CSN is also high, and the current flowing through transistor M11a of the amplifier 302 will be large. The current flowing through transistor M11a is reflected through transistor M5b via transistors M11c and M5a. The current flowing through transistors M5b and M2 is labeled I2. Tail current $I_N$ is proportional to I2, so, as input common voltage increases, I2 and $I_N$ also increase. The current flowing through transistor M1 is labeled I1. Tail current $I_P$ is proportional to I1 via reflection through transistors M12a, M12b, and M7a.

The translinear loop 304 includes transistors M1, M2, M3, and M4. The translinear loop 304 regulates currents I1 and I2, such that $\sqrt{I1}+\sqrt{I2}$ is constant. Thus, when current I2 is large, the translinear loop 304 produces a current I1 that is small, and when current I2 is small, the translinear loop 304 produces a current I1 that is large. Because currents $I_P$ and $I_N$ are respectively proportional to currents I1 and I2, currents $I_P$ and $I_N$ maintain the relationship described above with regard to currents I1 and I2. As common mode input voltage increases, current $I_N$ increases and current $I_P$ decreases. As common mode input voltage decreases, current $I_N$ decreases and current $I_P$ increases. By biasing the input transistor pairs 102 with currents $I_P$ and $I_N$, where $I_P$ and $I_N$ maintain $\sqrt{I_P}+\sqrt{I_N}$ as a constant, the variation in propagation delay caused by the input transistor pairs 102 is substantially reduced.

The translinear loop 304 operates to regulate the tail currents $I_P$ and $I_N$ when current is flowing through both transistor M1 and M2. In order to ensure proper operation of the translinear loop 304, the complementary tail current generator 104 includes a current source 306 in parallel with transistor M11c. The current source 306 provides for at least a small current flow (i.e., non-zero current flow) through transistor M5a, and corresponding current flows through transistors M1 and M2, when input common mode voltage is at extreme values (e.g., 0 volts or $V_{DD}$). The current $I_{BASE}$ provided by the current source 306 may be on the order of a few micro-amps. Thus, the complementary tail current generator 104 avoids breaking of the translinear loop 304 across all operational values of common mode input voltage, and provides currents $I_P$ and $I_N$ in the constant relationship described above across the full range of input common mode voltages.

Referring again to FIG. 2, the cascode stage 106 includes cascode transistors M23a, M23b, M22a, and M22b, and current sources 208 (208A-208D) and 210 (210A-210D). Current sources 208 and 210 respectively provide current $I_N$ and $I_P$ as per current sources 204 and 206 of the complementary tail current generator 104. One current source 208 and one current source 210 is coupled to each of nodes P1A and P1B at which a source terminal of a cascode transistor M23a or M23b is connected to a drain terminal of one of the input transistors M8a or M8b. Similarly, one current source 212 and one current source 210 is coupled to each of nodes N2A and N2B at which a source terminal of a cascode transistor M22a or M22b is connected to a drain terminal of one of the input transistors M9a or M9b.

Considering node P1A as representative, when the common mode voltage at the inputs of the differential receiver is large (e.g., approaching the power supply voltage), current $I_N$ generated by current source 208A is also large, and correspondingly current $I_P$ is small. In this case, the current through transistor M23a is large, the transconductance of transistor M23a is large, and the bandwidth associated with the node P1A is large (i.e., the parasitic pole at node P1A is far from the origin). The effect is similar when the common mode input voltage is low (e.g., 0 volts). Unfortunately, while currents $I_N$ and $I_P$ are generated such that $\sqrt{I_P}+\sqrt{I_n}$ is constant, $I_P+I_N$ is not constant and decreases substantially in an intermediate range of common mode input voltage (e.g., as the common mode input voltage approaches a midpoint between the power supply rails). When $I_P+I_N$ is small, the current flowing through transistor M23a is reduced relative to when $I_P+I_N$ is large (i.e., when the common mode input voltage approaches 0 volts or $V_{DD}$). Consequently, in an intermediate range of common mode input voltage, the bandwidth associated with the node P1A is reduced. Variation in bandwidth leads to variation in propagation delay.

Current source 210A provides additional current to the node P1A when $I_P+I_N$ is small. For example, the current provided by each current source 210 is $I_3-x(I_P+I_N)$ where $I_3$ is a constant current, and the output of each current source 210 increases as $I_P+I_N$ decreases. Thus, the cascode stage 106 moves the parasitic pole at the node P1A away from the origin at intermediate values of common mode input voltage, thereby preventing a reduction in bandwidth, and reducing the propagation delay variation associated with the differences in common mode voltage. Operation at the nodes P1B, N2A, and N2B is similar to that described with regard to node P1A.

The differential output stage 108 includes current sources 214 (214A and 214B) and 216 (216A and 216B), resistors RLN and RLP, and transistors MLN and MLP connected to operate as diodes. The current sources 214 provide current $I_{CM}$ for generation of common mode voltage at the differential outputs VOUTP and VOUTN. However, when the common mode voltage at the inputs of the differential receiver is small, the complementary tail current generator 104 generates a large current $I_P$ and a small current $I_N$. Consequently, much of current $I_{CM}$ flows through transistors M22a and M22b rather than through resistors RLN and RLP. If the current flowing through the resistors RLN and RLP changes, then the common mode voltage at the differential output changes. Variations in common mode voltage presented to the differential to single-ended converter 110 can cause variations in propagation delay through the differential to single-ended converter 110.

The current sources 216 provide a substantially constant output common mode voltage in the differential output stage 108. The current sources 216 increase the current provided for generation of differential output voltages VOUTP and VOUTN by injecting a current $$\frac{I_P - I_N}{2}$$

in addition to the current $I_{CM}$. Thus, when the common mode voltage at the inputs of the differential receiver 100 is small, $$\frac{I_P - I_N}{2}$$

is relatively large to compensate for the current of $I_{CM}$ flowing through the transistors M22a and M22b. Addition of the current $$\frac{I_P - I_N}{2}$$

produces a common mode voltage at VOUTP and VOUTN that is within a narrow range of voltages that optimizes the operation of the differential to single-ended converter 110.

The transistors MLN and MLP add a diode drop to the output common mode voltage without increasing the impedance or decreasing the bandwidth of the differential output stage 108.

Figure 4:
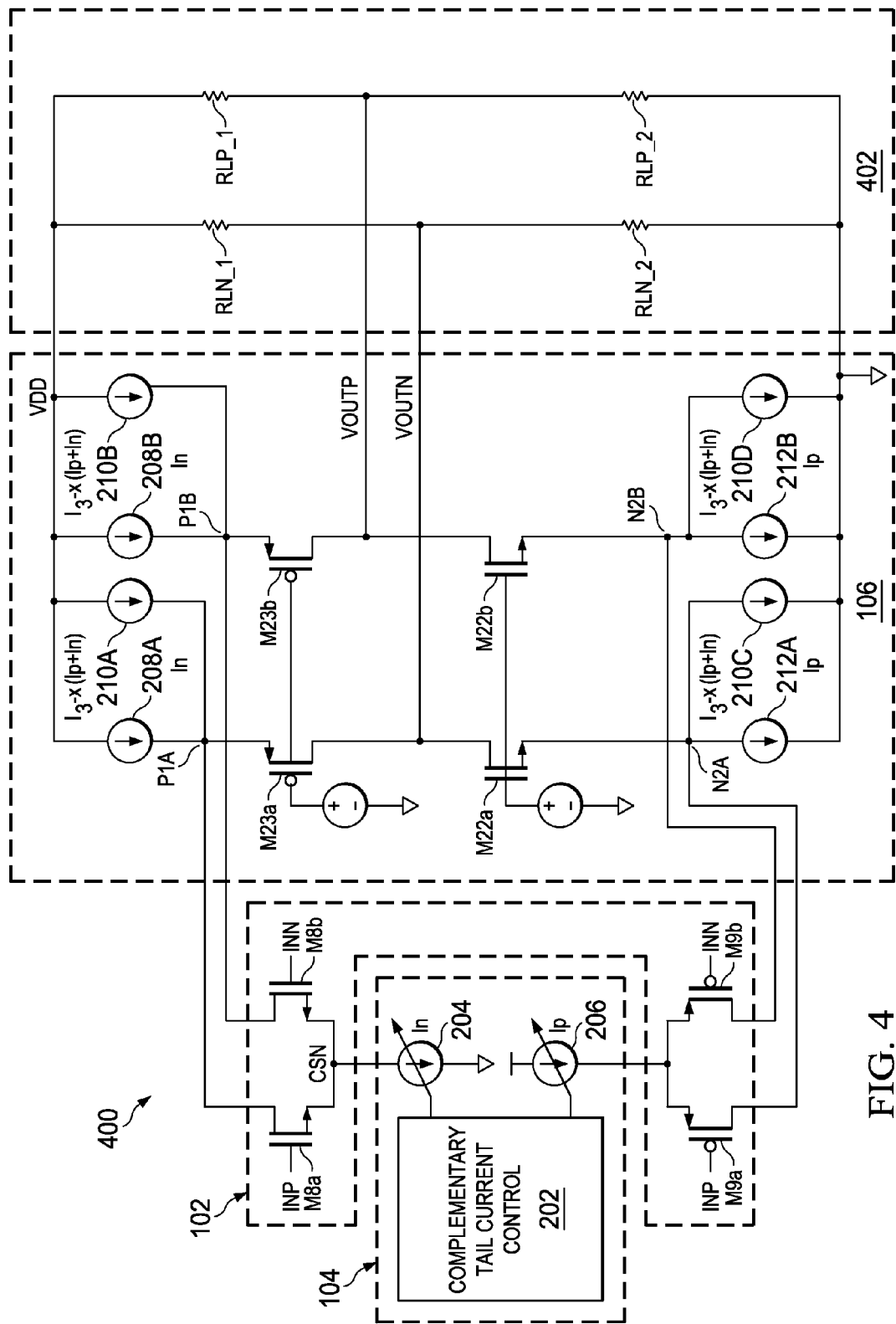
FIG. 4 shows a schematic diagram of a differential receiver in accordance with principles disclosed herein.

FIG. 4 shows a schematic diagram of a differential receiver 400 in accordance with principles disclosed herein. The differential receiver 400 is generally similar to the differential receiver 100, and includes the input transistor pairs 102, the complementary tail current generator 104, and the cascode stage 106 as described with regard to the differential receiver 100. The differential receiver 400 includes differential output stage 402 coupled to the cascode stage 106. Differential output stage 402 includes a first voltage divider including resistors RLN_1 and RLN_2 for generating the negative side VOUTN of the differential output signal. The differential output stage 402 also includes a second voltage divider including resistors RLP_1 and RLP_2 for generating the positive side VOUTP of the differential output signal.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A differential receiver, comprising:
    a first differential amplifier comprising a first transistor pair;
    a second differential amplifier comprising a second transistor pair; and
    a first current source coupled to a drain node of a first transistor of the first transistor pair, the first current source configured to generate a variable first current at the drain node as of function of a sum of a variable tail current of the first differential amplifier and a variable tail current of the second differential amplifier.

2. The differential receiver of claim 1, further comprising a second current source coupled to a drain node of a first transistor of the second transistor pair, the second current source configured to generate a current at the drain node of a first transistor of the second transistor pair as a function of the sum of the tail current of the first differential amplifier and the tail current of the second differential amplifier.

3. The differential receiver of claim 1, wherein the first current source is configured to increase the value of the first current as a sum of the variable tail current of the first differential amplifier and the variable tail current of the second differential amplifier decreases.

4. The differential receiver of claim 1, further comprising a tail current generator coupled to source terminals of the first transistor pair and to source terminals of the second transistor pair; wherein the tail current generator is configured to sense common mode voltage at inputs of the differential receiver and generate the tail current of the first differential amplifier and the tail current of the second differential amplifier based on the common mode voltage.

5. The differential receiver of claim 4, wherein the tail current generator is configured to:
    increase the tail current of the first differential amplifier as the common mode voltage at the inputs of the differential receiver increases;
    decrease the tail current of the second differential amplifier as the common mode voltage at the inputs of the differential receiver increases;
    decrease the tail current of the first differential amplifier as the common mode voltage at the inputs of the differential receiver decreases; and
    increase the tail current of the second differential amplifier as the common mode voltage at the inputs of the differential receiver decreases.

6. The differential receiver of claim 4, wherein the tail current generator comprises a translinear loop configured to regulate the tail current of the first differential amplifier and the tail current of the second differential amplifier such that a sum of the square roots of the tail current of the first differential amplifier and the tail current of the second differential amplifier is a constant value.

7. The differential receiver of claim 6, wherein the tail current generator comprises a current source that ensures current flow in the translinear loop over a full range of common mode voltage at inputs of the differential receiver.

8. The differential receiver of claim 5, further comprising:
    a differential to single-ended converter coupled to a differential output of the first and second differential amplifiers, and configured to convert a differential output signal at the differential output to a single-ended signal;
    a first output compensation current source coupled to a positive node of the differential output; and
    a second output compensation current source coupled to a negative node of the differential output;
    wherein the first and second output compensation current sources are configured to provide a constant common mode voltage at the differential output as the common mode voltage at inputs of the differential receiver changes.

9. The differential receiver of claim 8, wherein each of the first and second output compensation current sources is configured to generate a current equal to a portion of a difference of the tail current of the first differential amplifier and the tail current of the second differential amplifier.

10. The differential receiver of claim 8, further comprising a first diode connected between the positive node and ground, and a second diode connected between the negative node and ground; wherein the first diode and the second diode increase voltage at the differential output without increasing impedance of the differential output.

11. A differential receiver, comprising:
    a first differential amplifier comprising a first transistor pair;
    a second differential amplifier comprising a second transistor pair; and
    a tail current generator coupled to source terminals of the first transistor pair and to source terminals of the second transistor pair; wherein the tail current generator is configured to:
        sense a common mode voltage at inputs of the differential receiver; and
        generate a variable tail current of the first differential amplifier and a variable tail current of the second differential amplifier based on the common mode voltage.

12. The differential receiver of claim 11, wherein the tail current generator comprises:
    a translinear loop configured to regulate the tail current of the first differential amplifier and the tail current of the second differential amplifier such that a sum of the square roots of the tail current of the first differential amplifier and the tail current of the second differential amplifier is a constant value; and
    a current source that ensures current flow in the translinear loop over a full range of common mode voltage at the inputs of the differential receiver;
    wherein the tail current generator is configured to:
        increase the tail current of the first differential amplifier as the common mode voltage at the inputs of the differential receiver increases;
        decrease the tail current of the second differential amplifier as the common mode voltage at the inputs of the differential receiver increases;
        decrease the tail current of the first differential amplifier as the common mode voltage at the inputs of the differential receiver decreases; and
        increase the tail current of the second differential amplifier as the common mode voltage at the inputs of the differential receiver decreases.

13. The differential receiver of claim 11, further comprising:
a plurality of current sources, one of the current sources coupled to a corresponding drain node of each transistor of the first transistor pair and to a corresponding drain node of each transistor of the second transistor pair;
wherein each of the current sources is configured to generate a current at the corresponding drain node as of function of a sum of the tail current of the first differential amplifier and the tail current of the second differential amplifier.

14. The differential amplifier of claim 13 wherein each of the current sources is configured to increase a value of the current at the corresponding drain node as the common mode voltage at the inputs of the differential receiver approaches half a voltage powering the differential receiver.

15. The differential receiver of claim 11, further comprising a differential output stage configured to provide a differential output signal derived from the first and second differential amplifiers, the differential output stage comprising:
a first output compensation current source coupled to a positive node of the differential output; and
a second output compensation current source coupled to a negative node of the differential output;
wherein the first and second output compensation current sources are configured to provide a constant common mode voltage at the differential output stage regardless of the common mode voltage at the inputs of the differential receiver;
wherein each of the first and second output compensation current sources is configured to generate a current equal to a portion a difference of the tail current of the first differential amplifier and the tail current of the second differential amplifier.

16. A differential receiver, comprising:
a pair of negative metal oxide semiconductor (NMOS) transistors,
a pair of positive metal oxide semiconductor (PMOS) transistors;
a complementary tail current generator coupled to the pair of NMOS transistors and the pair of PMOS transistors, and configured to:
provide a variable first tail current to the source terminals of the NMOS transistors;
provide a variable second tail current to source terminals of the PMOS transistors; and
vary the first tail current and the second tail current based on common mode voltage at inputs of the differential receiver;
wherein the complementary tail current generator comprises:
a translinear loop configured to regulate the first tail current and the second tail current such that a sum of the square roots of the first tail current and the second tail current is a constant value; and
a current source configured to ensure that currents corresponding to the first tail current and the second tail current flow in the translinear loop at all common mode input voltages.

17. The differential receiver of claim 16, further comprising a cascode stage coupled to each drain terminal of the NMOS transistors and the PMOS transistors, the cascode stage comprising a plurality of bandwidth compensation current sources each configured to drive current into a cascode node connected to one of the drain terminals; wherein each of the bandwidth compensation current sources is configured to generate a current into the cascode node as of function of a sum of the first tail current and the second tail current.

18. The differential receiver of claim 17, further comprising a differential output stage configured to provide a differential output signal to a differential to single-ended conversion circuit, the differential output stage comprising:
a first output compensation current source coupled to a positive node of the differential output; and
a second output compensation current source coupled to a negative node of the differential output;
wherein the first and second output compensation current sources are configured to provide a constant common mode voltage at the differential output stage as the common mode voltage at the inputs of the differential receiver changes.

19. The differential receiver of claim 18, wherein the tail current generator is configured to:
increase the first tail current as the common mode voltage at the inputs of the differential receiver increases;
decrease the second tail current as the common mode voltage at the inputs of the differential receiver increases;
decrease the first tail current as the common mode voltage at the inputs of the differential receiver decreases; and
increase the second tail current as the common mode voltage at the inputs of the differential receiver decreases.

20. The differential receiver of claim 19, wherein each of the first and second output compensation current sources is configured to generate a current equal to a portion of the difference of the first tail current and the second tail current.

* * * * *